United States Patent
Scouten et al.

(10) Patent No.: US 8,390,358 B2
(45) Date of Patent: Mar. 5, 2013

(54) INTEGRATED JITTER COMPLIANT CLOCK SIGNAL GENERATION

(75) Inventors: Shawn Scouten, Ottawa (CA); Malcolm Stevens, North Gower (CA); Kevin Parker, Nepean (CA)

(73) Assignee: Cortina Systems, Inc., Sunnyvale, CA (US)

( * ) Notice: Subject to any disclaimer, the term of this patent is extended or adjusted under 35 U.S.C. 154(b) by 0 days.

(21) Appl. No.: 12/900,424

(22) Filed: Oct. 7, 2010

(65) Prior Publication Data

US 2012/0086491 A1    Apr. 12, 2012

(51) Int. Cl.
*H03K 3/00* (2006.01)
(52) U.S. Cl. .................... 327/295; 327/144; 327/297
(58) Field of Classification Search .................. 327/141, 327/144, 147, 156, 292, 295–297
See application file for complete search history.

(56) References Cited

U.S. PATENT DOCUMENTS

| | | | | |
|---|---|---|---|---|
| 6,009,532 A * | 12/1999 | Self et al. | ....................... | 713/400 |
| 7,103,855 B2 * | 9/2006 | Saeki | ............................ | 327/149 |
| 7,532,081 B2 * | 5/2009 | Partridge et al. | .............. | 331/154 |
| 2009/0128213 A1 * | 5/2009 | Rofougaran et al. | .......... | 327/295 |

* cited by examiner

*Primary Examiner* — An Luu

(57) ABSTRACT

Integrated jitter compliant clock signal generation apparatus and methods are provided. Input signals having different frequencies are used to generate respective clock signals having closely spaced frequencies. The input signals might be generated, for example, in adjacent Phase Locked Loops (PLLs) which receive reference clock signals. The reference clock signals, or signals from which the reference clock signals originate, are also closely spaced. The closely spaced reference clock signals are effectively separated for cleanup and then brought back together to provide the closely spaced clock signals. This allows cleanup of the closely spaced reference clock signals to occur at staggered and more widely spaced frequencies. These techniques could also be applied to reference clock signals which are harmonically related and are used to generate harmonically related output clock signals.

19 Claims, 3 Drawing Sheets

INTEGRATED JITTER COMPLIANT CLOCK SIGNAL GENERATION

FIELD OF THE INVENTION

This invention relates generally to clock signal generation and, in particular, to integration of multiple adjacent jitter compliant clock signal generators.

BACKGROUND

Crosstalk between adjacent clock signal generators can result in spurious emissions or spurs within a frequency band of interest. The frequency band of interest might be a measurement band within which noise must not exceed a certain level, for example.

In high frequency applications above 10 GHz for instance, a serializer/deserializer (serdes) Clock Multiplier Unit (CMU) with a fractional-N based frequency agile cleanup Phase Locked Loop (PLL) function must satisfy very tight noise specifications. However, the use of a fractional-N cleanup PLL to clean up an input reference signal to the CMU requires that the PLL must also be low bandwidth to filter out fractional-N noise or spurs and noise. This in turn can cause poor CMU crosstalk immunity, which can be especially problematic when multiple CMUs supply clock signals which are close in frequency. Integrating many CMUs on one die or board or within one package can cause CMU crosstalk to be a limiting factor for clock signal generation performance such as jitter performance.

Cleanup PLLs could be displaced from each other to reduce crosstalk. The cost associated with providing external cleanup PLLs, however, tends to be much greater than the cost of integrating PLLs on the same chip or board or in the same package as other components, such as the CMUs in the above example. Providing space between PLLs also consumes "real estate", which is limited in a chip, in a package, or on a board. In some applications, dozens of PLLs are needed.

Wider bandwidth PLLs might also reduce crosstalk, but as noted above, narrow bandwidth is preferred for cleanup PLLs. The narrow bandwidth preference might be based on specification requirements for removing jitter on incoming signals, for instance.

SUMMARY

According to one aspect of the invention, there is provided an apparatus that includes: a plurality of adjacent PLLs to provide respective PLL output signals having respective different frequencies; and a clock unit operatively coupled to receive the respective PLL output signals and to generate from the PLL output signals respective clock signals, the respective clock signals having closely spaced frequencies.

The apparatus could also include a reference clock signal source, operatively coupled to provide respective reference clock signals having respective different frequencies to the plurality of PLLs.

In some embodiments, the apparatus includes a reference clock signal source, operatively coupled to provide to the plurality of PLLs respective reference clock signals having closely spaced frequencies, and the plurality of PLLs apply respective different frequency multiplication factors to the respective reference clock signals to provide the respective PLL output signals.

The clock unit might include a plurality of adjacent clock unit modules respectively operatively coupled to receive the PLL output signals and to generate the respective clock signals.

In one embodiment, each clock unit module includes: an integer frequency divider operatively coupled to receive a respective one of the PLL output signals and to provide a divided output signal having a frequency that is a fraction of the frequency of the respective one of the PLL output signals; and an integer frequency multiplier operatively coupled to receive the divided output signal and to provide one of the respective clock signals having a frequency that is a multiple of the frequency of the divided output signal.

Each clock unit module, in another embodiment, includes: a fractional frequency multiplier operatively coupled to receive a respective one of the PLL output signals and to generate one of the respective clock signals having a frequency that is a fractional multiple of the frequency of the respective one of the PLL output signals.

Where each clock unit module includes a CMU, each CMU might include a further PLL. In some embodiments, the PLL of each CMU of each clock unit module has a wider bandwidth than the plurality of PLLs.

Another aspect of the invention provides an apparatus that includes: an input to receive a plurality of input signals having respective different frequencies; and a clock unit operatively coupled to receive the plurality of input signals and to generate from the input signals respective clock signals, the respective clock signals having closely spaced frequencies.

The clock unit might include a plurality of adjacent clock unit modules respectively operatively coupled to receive the PLL output signals and to generate the respective clock signals. As noted above, each clock unit module might include: an integer frequency divider operatively coupled to receive a respective one of the input signals and to provide a divided output signal having a frequency that is a fraction of the frequency of the respective one of the input signals; and an integer frequency multiplier operatively coupled to receive the divided output signal and to provide one of the respective clock signals having a frequency that is a multiple of the frequency of the divided output signal. Another possible implementation of each clock unit module includes: a fractional frequency multiplier operatively coupled to receive a respective one of the input signals and to generate one of the respective clock signals having a frequency that is a fractional multiple of the frequency of the respective one of the input signals.

In one embodiment, the input signals are generated by a plurality of PLLs, each clock unit module includes a CMU, with each CMU including a further PLL, and the PLL of each CMU of each clock unit module has a wider bandwidth than the plurality of PLLs.

A method is also provided, and includes: receiving a plurality of input signals having respective different frequencies; and generating from the input signals respective clock signals, the respective clock signals having closely spaced frequencies.

The method might also include: generating the plurality of input signals in respective adjacent PLLs. Where the respective clock signals are generated in respective further PLLs, each of the further PLLs might have a wider bandwidth than the respective adjacent PLLs.

In some embodiments, the method includes: providing respective reference clock signals having respective different frequencies to the respective PLLs.

The method might also include: providing to the respective PLLs respective reference clock signals having closely spaced frequencies, and each PLL applying a respective different frequency multiplication factor to its respective reference clock signals to provide a respective one of the input signals.

Generating the clock signals could include, for each respective clock signal: an integer frequency divide operation to provide a respective divided output signal having a frequency that is a fraction of the frequency of a respective one of the input signals; and an integer frequency multiply operation to receive the divided output signal and to provide one of the respective clock signals having a frequency that is a multiple of the frequency of the divided output signal.

The operation of generating the clock signals might instead include, for each respective clock signal: a fractional frequency multiply operation to generate one of the respective clock signals having a frequency that is a fractional multiple of the frequency of a respective one of the input signals.

Another aspect of the invention provides an apparatus including: a plurality of adjacent PLLs to provide respective PLL output signals having respective different frequencies; and a clock unit operatively coupled to receive the respective PLL output signals and to generate from the PLL output signals respective clock signals, the respective clock signals having harmonically related frequencies.

Other aspects and features of embodiments of the present invention will become apparent to those ordinarily skilled in the art upon review of the following description.

BRIEF DESCRIPTION OF THE DRAWINGS

Examples of embodiments of the invention will now be described in greater detail with reference to the accompanying drawings.

DETAILED DESCRIPTION

Figure 1:
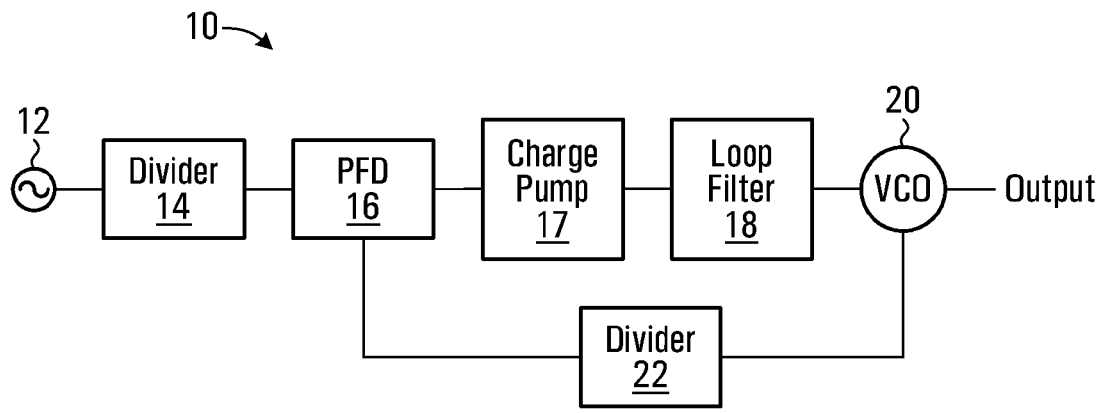
FIG. 1 is a block diagram of an example PLL.

FIG. 1 is a block diagram of an example PLL 10, which includes an oscillator 12, a divider 14, a phase-frequency detector (PFD) 16, a charge pump 17, a loop filter 18, a Voltage Controlled Oscillator (VCO) 20, and a divider 22. Those skilled in the art will be familiar with PLL implementations and their operation. The frequency of the output signal from the VCO 20 is dependent on the frequency of the reference signal provided by the oscillator 12 and the division factors applied by the dividers 14, 22. In general, $$f_{out} = \frac{N}{R} \times f_{ref}$$

where
$f_{out}$ is the frequency of the output signal from the VCO 20;
N is the division factor applied by the divider 22;
R is the division factor applied by the divider 14; and
$f_{ref}$ is the frequency of the reference signal provided by the oscillator 12.

In a fractional-N PLL, N is switched between different integers, to effectively provide a fractional division factor N for the divider 22.

Figure 2:
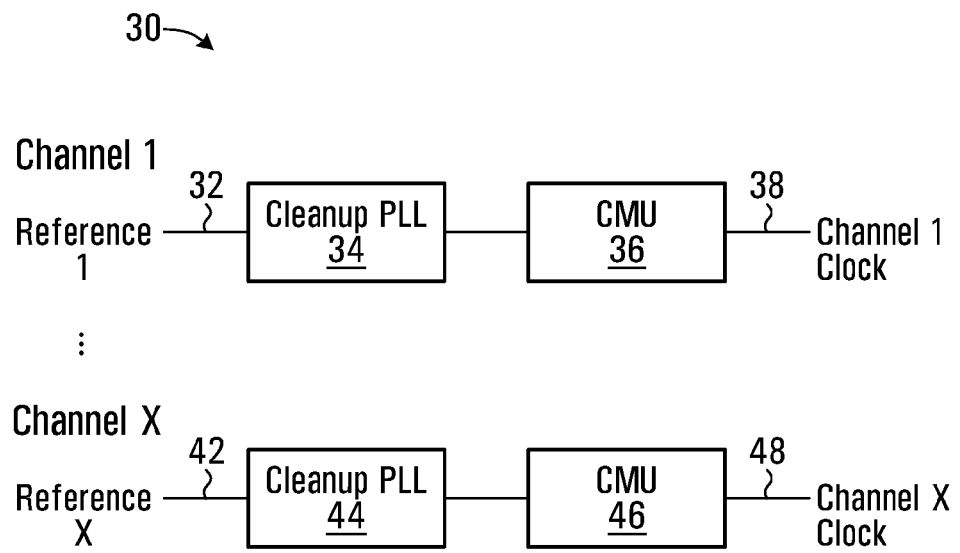
FIG. 2 is a block diagram of an example clock signal generation apparatus.

FIG. 2 is a block diagram of an example clock signal generation apparatus 30, which represents one possible application of a PLL. A cleanup PLL 34, 44 and a CMU 36, 46 are provided to generate respective clock signals at outputs 38, 48 for each of multiple channels 1 to X. As noted above, crosstalk between the cleanup PLLs 34, 44 and between the CMUs 36, 46 can be problematic, since cleanup PLLs normally have a narrow bandwidth, especially where the channels 1 to X include channels operating at substantially the same frequency.

In accordance with an aspect of the invention, narrow bandwidth cleanup PLLs are used, with cleanup PLL VCO reference frequencies being spaced wider than a jitter measurement band or other frequency band of interest. Low jitter integer dividers and wide bandwidth CMUs can then be used to synthesize CMU serial clocks from the frequency spaced PLL outputs, by first frequency dividing the PLL outputs down and then multiplying the divided frequencies up to the frequency of the CMU serial clocks, for example.

Figure 3:
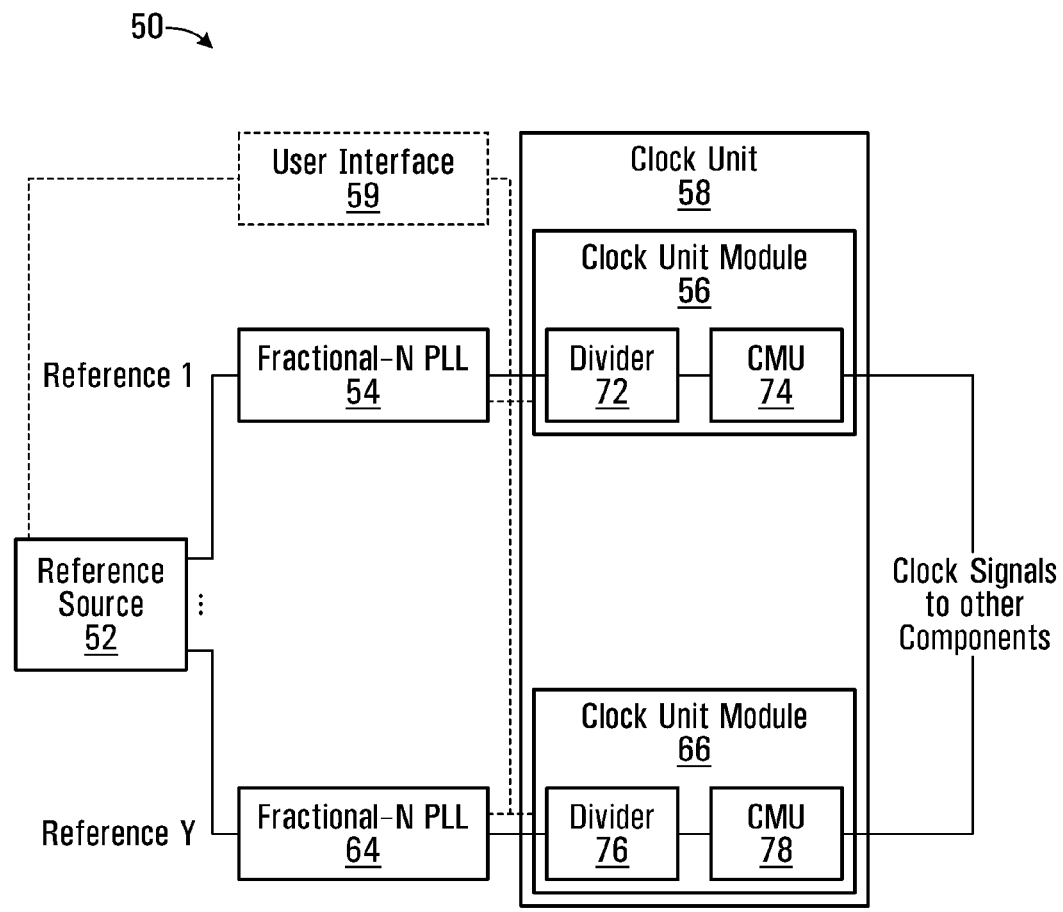
FIG. 3 is a block diagram of another example clock signal generation apparatus.

FIG. 3 is a block diagram of an example clock signal generation apparatus 50 having this type of structure. The example apparatus 50 includes a reference clock signal source 52, operatively coupled to fractional-N PLLs 54, 64, which are in turn operatively coupled to a clock unit 58. The clock unit 58 includes clock unit modules 56, 66, each of which includes a divider 72, 76 and a CMU 74, 78. The example apparatus 50 also includes a user interface 59.

It should be appreciated that the example apparatus of FIG. 3, is intended solely for illustrative purposes, and that the present invention is in no way limited to the particular example embodiment explicitly shown and described herein. For example, the cleanup PLLs need not necessarily be fractional-N PLLs, and a user interface 59 need not be provided in all embodiments. Other components which are not shown in FIG. 3 may also or instead be provided. The clock signals output by the CMUs 74, 78 could be provided to other components, such as components in a serdes and/or other types of components in a communication device, for instance.

The reference clock signal source 52 is intended to represent a component that supplies reference signals to the PLLs 54, 64. A primary purpose of a cleanup PLL is to filter jitter from a jittery input clock. Crosstalk becomes an issue when many inputs clocks are provided at slightly different frequencies. The original clock source from which the reference clock signal source 52 receives input clocks could be some master high precision reference sources whose timing is actually passed through an entire system. Thus, the reference clock signal source 52 need not actually generate input clocks from which reference signals for the PLLs 54, 64 are produced. The input clocks could be received from a further, external, master clock source and simply passed through to the PLLs 54, 64. The reference clock signal source 52 may, however, include components to shift or offset the reference signals that are provided to the PLLs 54, 64.

The fractional-N PLLs may have a structure as shown in FIG. 1, for example. Those skilled in the art will be familiar with various types of frequency dividers that might be suitable for implementing the dividers 72, 76. Various types of CMUs 74, 78, which may include additional PLLs, are also known. Although physical components to implement the elements shown in FIG. 3 might be known, their use and operation as disclosed herein would not be apparent to a skilled person without knowledge of the present invention.

Regarding the user interface 59, this component illustrates one possible option for providing user configuration and/or control of the example apparatus 50. The user interface 59 might include at least some sort of physical interface to a device or system through which a user can at least enter configuration information for controlling division ratios of the PLLs 54, 64 and/or the dividers 72, 76 and possibly also or instead multiplication ratios of the CMUs 74, 78. A user could also or instead control frequency spacing of the reference signals provided by the reference clock signal source 52 if this source implements a frequency spacing function to increase frequency spacing between the reference signals by shifting or offsetting the reference signals from each other. Where the apparatus 50 is implemented in communication equipment, for example, the user interface could be an interface or connection to an equipment control terminal.

In one embodiment, the apparatus 50 is integrated on a single die or chip such as an Application Specific Integrated Circuit (ASIC) or an Application Specific Standard Part (ASSP), on a single board, or in a single package. Conventional clock generator implementations would not be suitable for this level of integration, due to noise specifications or other performance requirements for instance. More generally, the apparatus 50 is implemented such that the PLLs 54, 64 and the CMUs 74, 78 are proximate or adjacent each other, within an "interference distance". Interference distance refers to a distance within which conventional PLLs and/or CMUs could affect each other, through crosstalk for example. In general, the clock sources to be cleaned by the cleanup PLLs 54, 64 will be different frequencies in very close proximity, in which case crosstalk becomes an issue.

The fractional-N PLLs 54, 64 provide respective PLL output signals having respective different frequencies. The clock unit 58 is operatively coupled to receive the respective PLL output signals and to generate respective clock signals from the PLL output signals. The respective clock signals have closely spaced frequencies. It should be noted that not all of the channels 1 to Y shown in FIG. 3 need necessarily be operating at substantially the same frequency. Among those channels, at least some operate at substantially the same frequency. Thus, the clock signals provided by the clock unit 58 includes at least two clock signals that have closely spaced frequencies, and may also include one or more additional clock signals at a different frequency or at more widely spaced frequencies.

Closely spaced frequencies might refer to frequencies which are a few parts per million (ppm) or percent apart, such as within approximately 2 ppm to 100 k ppm (10%) of each other. Similarly, closely spaced outputs from the clock unit 58 could be within about the same range of each other. In some cases, absolute spacing in terms of frequency rather than ppm or percent may come into play, with cross-talk not being a significant issue at frequency spacings above a certain level.

In a more general sense, the input clock signals received at the reference clock signal source or the PLLs 54, 64 and outputs from the clock unit 58 are more closely spaced in frequency than the signals used during cleanup in the PLLs 54, 64. Frequencies might be considered to be closely spaced where those frequencies approximate the same frequency of interest, such as a target reference frequency or a channel frequency, and interfere with each other. The input clock signals received at the reference clock signal source 52 might approximate a target or center reference frequency but are not identical, and the outputs from the clock unit 58 might approximate a channel center frequency but again are not exactly the same frequency in the above example. As noted above, crosstalk between signals can become problematic when those signals have different frequencies which are in close proximity. Above a certain level of spacing or offset between frequencies, crosstalk becomes less of an issue, and thus there might be less motivation to reduce crosstalk by using the techniques disclosed herein. Signals having this order of spacing might not be considered to be closely spaced.

The reference clock signal source 52 provides respective reference clock signals to the PLLs 54, 64. These reference clock signals have respective different frequencies, which are not closely spaced, in one embodiment. Although the reference clock signal source 52 might itself receive input clock signals having closely spaced frequencies, the reference clock signal source could apply frequency offsets to those input signals in order to separate the signals for cleanup by the PLLs 54, 64.

In some embodiments, the reference clock signal source 52 provides respective reference clock signals, having closely spaced frequencies, to the PLLs 54, 64. The PLLs 54, 64 could then apply respective different frequency multiplication factors to those reference clock signals to provide the PLL output signals, which as noted above have different frequencies.

This illustrates that a frequency offset between PLL output signals could be provided in at least two ways. The reference source 52 could include offset components to provide a frequency offset between the reference clock signals that are output to the PLLs 54, 64. Another option is to provide the PLLs 54, 64 with reference signals having closely spaced frequencies, and have the PLLs apply different frequency multiplication factors to the reference signals. In the latter case, the PLLs could be programmed or otherwise configured with different division factors for their reference and loop dividers 14, 22 (FIG. 1).

The present invention is not limited to any specific manner of providing the PLL frequency offset. The effect of the offset is to move spurs from neighboring PLLs, ideally to outside a frequency band of interest. The reference clock signals could be offset by as little as a few parts per million apart, which tends to be the worst case for CMU crosstalk. Examples of frequency offsets and their effects are provided below.

Referring again to FIG. 3, the clock unit 58 receives, at an input which could be one or more board traces or some other type of connection for instance, multiple of input signals having respective different frequencies. These input signals are the PLL output signals in the apparatus 50. In the example shown, the clock unit 58 includes multiple adjacent clock unit modules 56, 66 which are respectively operatively coupled to receive the PLL output signals from the PLLs 54, 64 and to generate respective output clock signals. In the example apparatus 50, each clock unit module 56, 66 includes an integer frequency divider 72, 76 operatively coupled to receive a respective one of the PLL output signals and to provide a divided output signal having a frequency that is a fraction of the frequency of the respective one of the PLL output signals. Each CMU 74, 78 is an integer frequency multiplier in one embodiment, and is operatively coupled to receive the divided output signal from a divider 72, 76 and to provide one of the clock signals. The clock signal provided by a CMU 74, 78 has a frequency that is a multiple of the frequency of the divided output signal that it receives from a divider 72, 76.

Although a divider 72, 76 and a CMU 74, 78 are shown in each clock unit module 56, 66, it is also contemplated that each clock unit module could include a fractional frequency multiplier operatively coupled to receive a respective one of the PLL output signals and to generate one of the output clock signals. In this case each output clock signal has a frequency that is a fractional multiple of the frequency of the respective one of the PLL output signals from which it was generated. Thus, the frequency conversion effect of dividing a PLL output signal down and subsequently multiplying a divided signal back up could potentially be accomplished by a fractional multiplier.

The CMUs 74, 78 may be or include further PLLs. The PLL of each CMU of each clock unit module 56, 66 has a wider bandwidth than the plurality of PLLs 54, 64, which allows each CMU to reject crosstalk from other channels.

Overall, the apparatus 50 may apply effectively the same multiplication factor in each channel, through the cleanup PLLs 54, 64 and clock unit modules 56, 66. However, this allows cleanup of closely spaced input clock signals to occur at staggered and more widely spaced frequencies, before they are brought back together in close proximity at the outputs of the clock unit 58.

Figure 4:
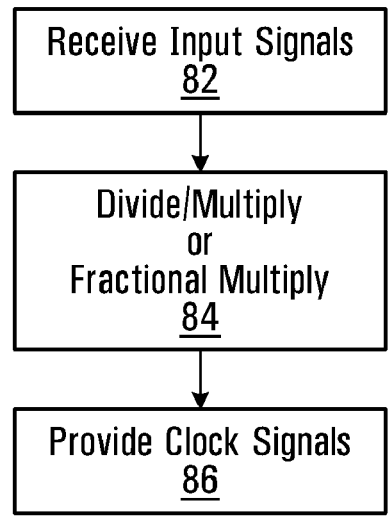
FIG. 4 is a flow diagram of an example clock signal generation method.

Embodiments of the invention have been described above primarily in the context of the example apparatus 50. FIG. 4 is a flow diagram of an example clock signal generation method in accordance with another embodiment.

The example method 80 involves receiving at 82 a plurality of input signals having respective different frequencies. At 84, the input signals are divided and multiplied, or fractionally multiplied, so as to generate respective clock signals from the input signals. The clock signals have closely spaced frequencies, and may be provided to components which use those clock signals at 86.

FIG. 4 illustrates one embodiment. Other embodiments may include further, fewer, or different operations performed in a similar or different order. For example, the input signals could be generated in respective adjacent PLLs, illustratively fractional-N PLLs, in some embodiments.

Further variations in the operations performed, and/or the ways in which operations could be performed, may also be or become apparent. At least some possible variations will be evident from FIG. 3 and the foregoing description thereof.

Embodiments of the invention as disclosed herein may allow crosstalk spurs to be moved outside a frequency band of interest which might be a measurement band for certain performance requirements. For example, for Synchronous Optical NETwork-Optical Transport Network (SONET-OTN), jitter is only measured in the band below 80 MHz. For XFI, jitter is only measured in the band below 10 MHz.

In the interest of further illustrating the apparatus and techniques disclosed herein, consider an illustrative example in which a fixed reference serdes has a CMU multiple of 64 with a 155.52 MHz reference clock signal and wide bandwidth for noise immunity. An integer divider could be added to this serdes, and then different serdes on the same die could be configured with different integer CMU multiples (e.g., 60, 61, 62, 63, etc.) and wide CMU bandwidth to provide crosstalk immunity. Wide bandwidth serdes CMUs have much better VCO crosstalk immunity, and integer multiples tend to result in lower jitter.

Separate cleanup PLLs could also be implemented with narrow bandwidth, but operating at VCO output frequencies which are spaced apart. Frequency spacing for SONET could be >80 MHz, and for XFI the frequency spacing could be >10 MHz. Fixed integer dividers could then be provided at the PLL outputs to provide reference signals to serdes CMUs, which in turn generate clock signals at a final CMU serial rate. The narrow bandwidth in the cleanup PLLs removes fractional-N spurs where fractional-N PLLs are used for instance, and frequency spacing at the PLL outputs moves crosstalk spurs out of band for the SONET or XFI jitter measurements in this example.

In another example, two channels operate at the same rate with 140 MHz cleanup PLL spacing. Channel 1 has a serdes rate of 9.95238 GHz, with a CMU multiple or multiplication factor of 63 and an input reference signal of 157.974 MHz. If the output signal from its cleanup PLL has a frequency of 8.689 GHz, then an integer division factor of 55 can be used to create the reference signal for the serdes CMU. For channel 2 at the same serdes rate of 9.95238 GHz but having a CMU multiple of 62, a reference from its cleanup PLL at 160.522 MHz and a cleanup PLL frequency of 8.8295 GHz, the same integer division factor of 55 applies. In this example, frequency spacing of the input reference signals is less than 3 MHz, whereas the PLL frequency spacing is significantly higher, about 140 MHz.

Figure 5:
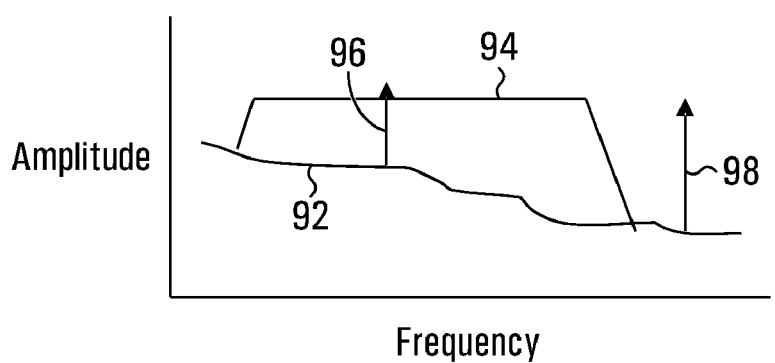
FIG. 5 is an example plot illustrating spurs and a measurement band.

FIG. 5 is an example plot 90 illustrating spurs and a measurement band. In FIG. 5, amplitude of a signal for which a measurement is to be made is shown at 92, a measurement band is shown at 94, and spurs are shown at 96, 98. The spur 96 is within the measurement band 94, and the spur 98 actually represents the same spur which has been moved outside the measurement band using the techniques disclosed herein.

The example plot 90 is not intended to be to scale. Similar or different amplitude characteristics, measurement bands, spur sizes and/or spur positions may be observed or used. The effect of crosstalk reduces with offset of the spur 96, even when inside the measurement band. Thus, it could be sufficient to provide some offset, but not enough to move spurs entirely outside a measurement band. For instance, for OC-192, the measurement band is 20 kHz to 80 MHz. A conventional clock generator might produce spurs at 400 kHz and lower, which could ideally be moved to above 80 MHz, outside the measurement band. However, some improvement could be realized from even moving the spurs to 20 MHz, which is still within the measurement band but higher in that band.

What has been described is merely illustrative of the application of principles of embodiments of the invention. Other arrangements and methods can be implemented by those skilled in the art without departing from the scope of the present invention.

For example, embodiments are not in any way limited to the division of functions as shown in FIG. 3.

In terms of applications, integration of many fractional cleanup PLLs could be applied to various standards or protocols involving clocks which are in close proximity and need cleanup. Such integration is typically not presently done because of noise immunity issues. Prior techniques generally use expensive off chip cleanup PLLs. Ethernet, SONET, OTN, for example, have clock regeneration included. Fiber Channel could benefit where signals from another standard run through the same silicon, for instance.

Embodiments are also not limited to any particular rates or frequencies.

The techniques disclosed herein could also be applied to frequency cleanup for signals that are not necessarily closely spaced but still interfere with each other. For instance, output frequencies could be different, but with harmonic content. An example would be Fiber Channel and 10GE in the same card or package. In this case, adjacent PLLs (e.g., 54, 64 in FIG. 3) could provide respective PLL output signals having respective different frequencies, and a clock unit such as the clock unit 58 in FIG. 3 could then receive the PLL output signals and generate respective clock signals having harmonically related frequencies. The clock signal frequencies are harmonically related where the frequency of at least one clock signal is substantially a harmonic of the frequency of at least one other clock signal. It should be appreciated that there might be some variation between base and harmonic frequencies.

In addition, although described primarily in the context of methods and systems, other implementations of the invention are also contemplated, as instructions stored on a non-transitory computer-readable medium, for example.

We claim:

1. An apparatus comprising:
   a plurality of adjacent Phase Locked Loops (PLLs) to provide respective PLL output signals having respective different frequencies; and
   a clock unit operatively coupled to receive the respective PLL output signals and to generate from the PLL output signals respective clock signals, the respective clock signals having different frequencies,
   the clock unit comprising a plurality of adjacent clock unit modules respectively operatively coupled to receive the PLL output signals and to generate the respective clock signals,
   each clock unit module comprising a Clock Multiplier Unit (CMU), each CMU comprising a further PLL.

2. The apparatus of claim 1, further comprising:
   a reference clock signal source, operatively coupled to provide respective reference clock signals having respective different frequencies to the plurality of PLLs.

3. The apparatus of claim 1, further comprising:
   a reference clock signal source, operatively coupled to provide to the plurality of PLLs respective reference clock signals having different frequencies,
   the plurality of PLLs applying respective different frequency multiplication factors to the respective reference clock signals to provide the respective PLL output signals.

4. The apparatus of claim 1, wherein each clock unit module further comprises:
   an integer frequency divider operatively coupled to receive a respective one of the PLL output signals and to provide a divided output signal having a frequency that is a fraction of the frequency of the respective one of the PLL output signals; and
   an integer frequency multiplier operatively coupled to receive the divided output signal and to provide one of the respective clock signals having a frequency that is a multiple of the frequency of the divided output signal.

5. The apparatus of claim 1, wherein each clock unit module further comprises:
   a fractional frequency multiplier operatively coupled to receive a respective one of the PLL output signals and to generate one of the respective clock signals having a frequency that is a fractional multiple of the frequency of the respective one of the PLL output signals.

6. The apparatus of claim 1, wherein the PLL of each CMU of each clock unit module has a wider bandwidth than the plurality of PLLs.

7. The apparatus of claim 1, the different frequencies of the respective clock signals being within 2 parts per million of each other.

8. The apparatus of claim 1, the different frequencies of the respective clock signals being within 100,000 parts per million of each other.

9. The apparatus of claim 1, the different frequencies of the respective clock signals being within 10% of each other.

10. The apparatus of claim 1, the different frequencies of the respective clock signals being more closely spaced than the different frequencies of the PLL output signals.

11. An apparatus comprising:
    inputs to receive a plurality of input signals, generated by a plurality of Phase Locked Loops (PLLs), having respective different frequencies; and
    a clock unit operatively coupled to receive the plurality of input signals and to generate from the input signals respective clock signals, the respective clock signals having different frequencies,
    the clock unit comprising a plurality of adjacent clock unit modules respectively operatively coupled to receive the plurality of input signals and to generate the respective clock signals,
    each clock unit module comprising a Clock Multiplier Unit (CMU), each CMU comprising a further PLL, the PLL of each CMU of each clock unit module having a wider bandwidth than the plurality of PLLs.

12. The apparatus of claim 11, wherein each clock unit module further comprises:
    an integer frequency divider operatively coupled to receive a respective one of the input signals and to provide a divided output signal having a frequency that is a fraction of the frequency of the respective one of the input signals; and
    an integer frequency multiplier operatively coupled to receive the divided output signal and to provide one of the respective clock signals having a frequency that is a multiple of the frequency of the divided output signal.

13. The apparatus of claim 11, wherein each clock unit module further comprises:
    a fractional frequency multiplier operatively coupled to receive a respective one of the input signals and to generate one of the respective clock signals having a frequency that is a fractional multiple of the frequency of the respective one of the input signals.

14. A method comprising:
    providing respective reference clock signals having respective different frequencies to a plurality of adjacent Phase Locked Loops (PLLs);
    generating a plurality of input signals having respective different frequencies in the plurality of adjacent PLLs;
    receiving the plurality of input signals; and
    generating from the input signals respective clock signals, the respective clock signals having different frequencies.

15. The method of claim 14, further comprising:
    each PLL applying a respective different frequency multiplication factor to its respective reference clock signal to provide a respective one of the input signals.

16. The method of claim 14, wherein generating the respective clock signals comprises, for each respective clock signal:
    an integer frequency divide operation to provide a respective divided output signal having a frequency that is a fraction of the frequency of a respective one of the input signals; and
    an integer frequency multiply operation to receive the divided output signal and to provide one of the respective clock signals having a frequency that is a multiple of the frequency of the divided output signal.

17. The method of claim 14, wherein generating the respective clock signals comprises, for each respective clock signal:
    a fractional frequency multiply operation to generate one of the respective clock signals having a frequency that is a fractional multiple of the frequency of a respective one of the input signals.

18. A method comprising:
    generating a plurality of input signals having respective different frequencies in a plurality of adjacent Phase Locked Loops (PLLs);
    receiving the plurality of input signals; and
    generating from the input signals respective clock signals, the respective clock signals having different frequencies,
    wherein generating respective clock signals comprises generating the respective clock signals in respective further PLLs, each of the further PLLs having a wider bandwidth than the respective adjacent PLLs.

19. An apparatus comprising:

a plurality of adjacent Phase Locked Loops (PLLs) to provide respective PLL output signals having respective different frequencies; and a clock unit operatively coupled to receive the respective PLL output signals and to generate from the PLL output signals respective clock signals, the respective clock signals having harmonically related frequencies.

* * * * *